(12) United States Patent
Czamara et al.

(10) Patent No.: US 9,766,670 B1
(45) Date of Patent: Sep. 19, 2017

(54) MANAGING POWER TO ELECTRICAL SYSTEMS

(75) Inventors: Michael P. Czamara, Seattle, WA (US); Jonathan David Hay, Kirkland, WA (US)

(73) Assignee: Amazon Technologies, Inc., Reno, NV (US)

( * ) Notice: Subject to any disclaimer, the term of this patent is extended or adjusted under 35 U.S.C. 154(b) by 1028 days.

(21) Appl. No.: 13/540,369

(22) Filed: Jul. 2, 2012

(51) Int. Cl.
*H02J 3/14* (2006.01)
*G06F 1/26* (2006.01)
*H05K 7/14* (2006.01)

(52) U.S. Cl.
CPC ............ *G06F 1/26* (2013.01); *H05K 7/1492* (2013.01); *Y02B 70/3225* (2013.01)

(58) Field of Classification Search
CPC ............... Y02B 70/3225; Y04S 20/222; H02J 2003/003; H05K 7/1492; G06F 1/26
See application file for complete search history.

(56) References Cited

U.S. PATENT DOCUMENTS

| 5,949,974 | A  | * | 9/1999  | Ewing et al. ............... 709/202 |
| 6,278,605 | B1 | * | 8/2001  | Hill .......................... 361/600 |
| 8,054,598 | B1 | * | 11/2011 | Sadler et al. .................. 361/63 |
| 8,539,274 | B2 |   | 9/2013  | Atkins et al. |
| 8,836,175 | B1 | * | 9/2014  | Eichelberg ............... G06F 1/263 307/147 |
| 9,182,795 | B1 | * | 11/2015 | Hill .......................... G06F 1/189 |
| 2007/0168088 | A1 | * | 7/2007 | Ewing et al. ................. 700/295 |
| 2009/0282274 | A1 | * | 11/2009 | Langgood ............ G06F 1/3203 713/320 |
| 2010/0085894 | A1 | * | 4/2010 | Johnson et al. .............. 370/254 |
| 2011/0101777 | A1 | * | 5/2011 | Jansma .......................... 307/38 |
| 2011/0245988 | A1 | * | 10/2011 | Ingels et al. .................. 700/295 |
| 2014/0208130 | A1 | * | 7/2014 | Morales .................... G06F 1/30 713/300 |

OTHER PUBLICATIONS

Circuit, "Fuji Electric UL 489 Rated Molded Case Circuit Breakers (MCCBs)", downloaded Jun. 15, 2012, pp. e31-2 to e31-5.

\* cited by examiner

*Primary Examiner* — Daniel Cavallari
(74) *Attorney, Agent, or Firm* — Robert C. Kowert; Meyertons, Hood, Kivlin, Kowert & Goetzel, P.C.

(57) ABSTRACT

A data center includes rack computing systems, electrical power system, and a circuit control device. The rack computing systems may include a rack and computing devices coupled to the rack. The electrical power system supplies power to computing devices in the racks. Each electrical power system may include overcurrent protection devices that protect computing devices in the rack computing systems from overcurrent conditions. The circuit control device is coupled to the overcurrent protection devices. The circuit control device can trigger the circuit protection devices to shed loads on the electrical power system from computing devices in the rack computing systems.

38 Claims, 5 Drawing Sheets

MANAGING POWER TO ELECTRICAL SYSTEMS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

From time to time, conditions in a data center may cause a power distribution system to be overloaded. In some cases, an overload may be caused by a fault or unexpected increase in usage in particular computing devices in the data center (for example, servers in particular racks, or servers performing services for a particular customer). In other cases, an overload may be caused by an aggregation of loads from various servers and racks in the data center. In any case, an overload of electrical power systems may result in an unexpected disruption of power to servers and other electrical systems in the data center. Such a loss of power may in turn result in disruption of computing services, lost data, or both, as well as increased labor costs, for example, in restoring power and services in the data center.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods for managing power to electrical systems, such as computing devices in a data center, are disclosed. According to one embodiment, a data center includes rack computing systems, electrical power system, and a circuit control device. The rack computing systems may include a rack and computing devices coupled to the rack. The electrical power system supplies power to computing devices in the racks. The electrical power systems may include overcurrent protection devices (for example, circuit breakers) that protect computing devices in the rack computing systems from overcurrent conditions. The circuit control device is coupled to the overcurrent protection devices. The circuit control device can trigger the circuit protection devices to shed loads on the electrical power system from at least part of the computing devices in the rack computing systems.

According to one embodiment, a system includes rack systems, an electrical power system, and a load shedding control system. The rack systems may include a rack and electrical systems (for example, servers) coupled to the rack. The electrical power system supplies power to electrical systems in the racks. The electrical power system may include, for each of the rack systems, switching devices that can switch power from the electrical power system to electrical systems in the rack system. The load shedding control system is coupled to the switching devices. The load shedding control system can operate switching devices to shed loads on the electrical power system from electrical systems in the rack systems.

According to one embodiment, a method includes supplying power to electrical systems (for example, servers) in rack systems in one or more facilities with one or more electrical power systems. Switching devices can be operated to shed loads on the electrical power system from the electrical systems in at least one of the rack systems. The shedding of the loads is based on conditions in the electrical power system.

According to one embodiment, a load shedding control system includes a controller and one or more switching devices coupled to the controller. The controller can operate the switching devices to shed loads on an electrical power system that is supplying electrical power to computing devices operating in a data center.

As used herein, a "cable" includes any cable, conduit, or line that carries one or more conductors and that is flexible over at least a portion of its length. A cable may include a connector portion, such as a plug, at one or more of its ends.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "computer room" means a room of a building in which computer systems, such as rack-mounted servers, are operated.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, one component in a power distribution system is "downstream" from another component in the power distribution system if the one component receives power from the other component or is at a lower level in the power distribution system than the other component. For example, a floor PDU may be downstream from a UPS, or a power supply unit in a server may be downstream from a rack PDU.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "power distribution unit" means any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.). A power distribution unit may include a transformer, power monitoring, fault detection, isolation.

As used herein, "power panel" means any panel, device, module, component, or combination thereof, that can be used to transfer or distribute electrical power from one or more input conductors to one or more output conductors. In certain embodiments, a remote power panel includes main lug only panel conductors. A remote power panel may be housed in an enclosure, such as a cabinet.

As used herein, "primary power" means any power that can be supplied to an electrical load, for example, during normal operating conditions.

As used herein, a "rack" means a rack, container, frame, or other element or combination of elements that can contain or physically support one or more computing devices.

As used herein, a "rack computing system" means a computing system that includes one or more computing devices mounted in a rack.

As used herein, "rack power distribution unit" refers to a power distribution unit that can be used to distribute electrical power to various components in a rack. A rack power distribution may include various components and elements, including wiring, bus bars, connectors, and circuit breakers.

As used herein, "reserve power" means power that can be supplied to an electrical load upon the failure of, or as a substitute for, primary power to the load.

As used herein, "source power" includes power from any source, including but not limited to power received from a utility feed. In certain embodiments, "source power" may be received from the output of a transformer.

As used herein, a "switching device" means any device, element, or combination thereof, that can be operated to open or close an electrical switch.

In some embodiments, a load shedding control system can shed loads on an electrical power system by operating switching devices for electrical loads in rack systems. In one embodiment, the switching devices trip circuit breakers in power panels that supply power to electrical systems (for example, servers) in the racks.

In an embodiment, a series of devices that can either be preprogrammed to shed load from a segment within a data center or facilities electrical system (for example, a panel, transformer, switchboard, UPS, PDU, or panel). During setup of a load shedding system, a user may have the option to set timers and sequence as to how and when the breakers are opened. In some embodiments, the user sets the amount to be load shed. In certain embodiments, the user may allow for system checks and stability to occur during the load shedding, or a general event that may be occurring or may or need to occur.

Figure 1:
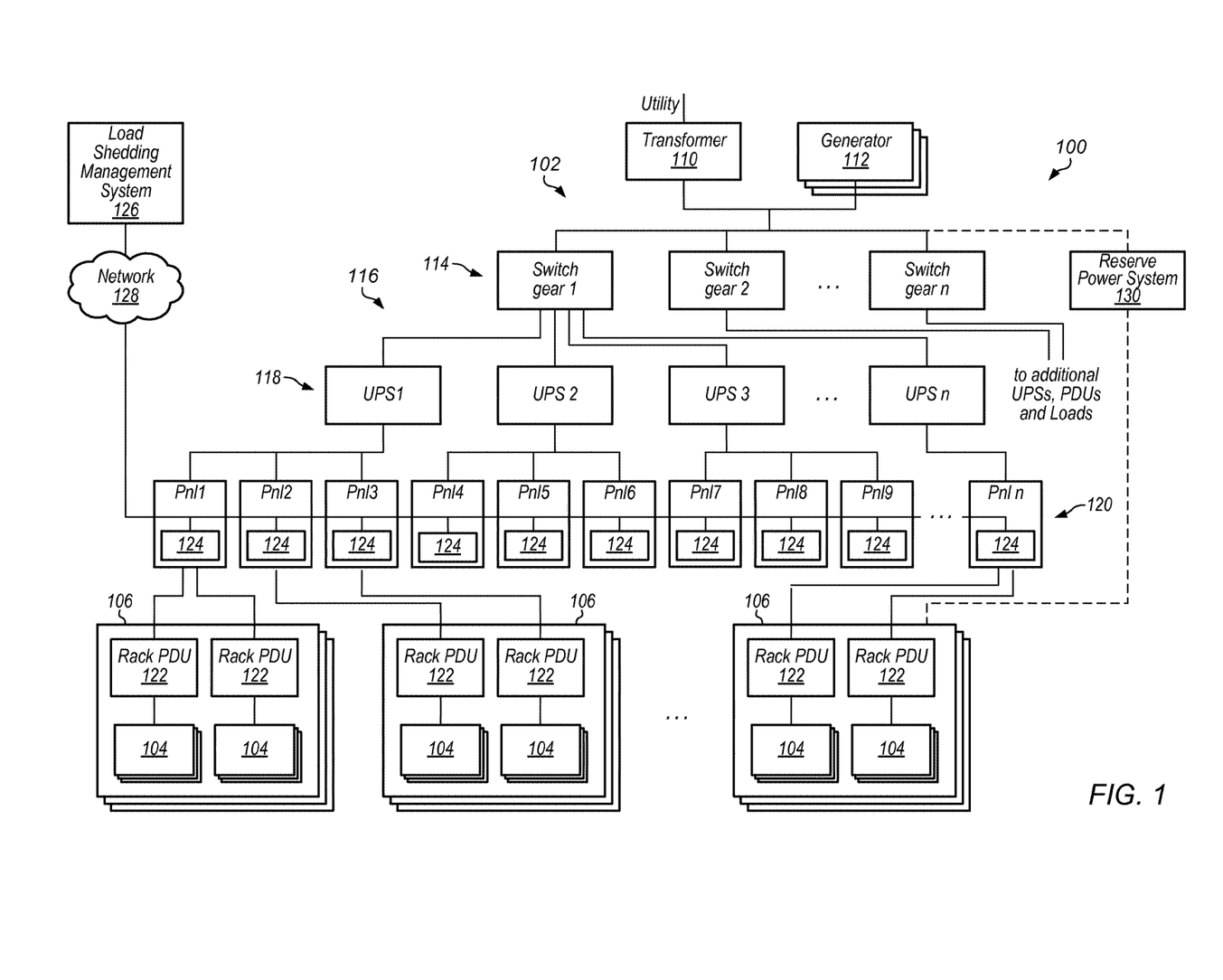
FIG. 1 is a block diagram illustrating one embodiment of a power distribution system with load shedding devices in power panels that supply power to rack-mounted electrical systems.

FIG. 1 is a block diagram illustrating one embodiment of a power distribution system with load shedding devices in power panels that supply power to rack-mounted electrical systems. System 100 includes power distribution system 102 and electrical systems 104. In one embodiment, system 100 is a data center. Electrical systems 104 may include, for example, computing devices, rack-mounted servers, network control devices, power supply units, air moving devices, and mass storage devices. Electrical systems 104 may be supported in racks 106. Electrical systems 104 may perform various functions in a data center, such as data storage or network services. In one embodiment, electrical systems 104 are servers in a server room of a data center.

Each of electrical systems 104 may include a power supply unit. The power supply unit may supply power to various electrical components, such as integrated circuits, central processing units, solid state memory, and hard disk drives in electrical systems 104.

Power distribution system 102 includes transformer 110, generators 112, switchgear apparatus 114, and primary power systems 116. Each of primary power systems 116 includes UPS 118 and one or more power panels 120.

Electrical systems 104 in racks 106 may each receive power from one of primary power systems 116. In one embodiment, each of primary power systems 116 corresponds to, and provides power to, the servers in one room in a data center. In one embodiment, each of primary power systems 116 corresponds to, and provides power to, one rack system in a data center. In FIG. 1, for the sake of clarity, electrical systems 104 are shown coupled to only one of power panels 120. Electrical systems may, however, be coupled to any or all of power panels 120 in a data center.

Power panels 120 may distribute power from UPSs to electrical systems 104 in racks 106. Power panels 120 may include circuit protection devices, such as circuit breakers. In certain embodiments, power panels 120 are floor power distribution units. In some embodiments, some or all of power panels 120 include a transformer that transforms the voltage from switchgear apparatus 114.

Each of racks 106 may include one or more rack power distribution units 122. The rack power distribution units 122 may distribute power to power supply units in computer systems 104. In one embodiment, each rack power distribution unit 122 distributes electrical power to half of a rack.

Power panels 120 include load shedding devices 124. Load shedding devices 124 may be coupled to load shedding management system 126 by way of network 128. Load shedding devices 124 may operate to shed loads from electrical systems 104 off of power distribution system 102. Load shedding devices 124 may be triggered to shed loads on a load circuit-by-load circuit basis. For example, a load shedding device may be operated to shed loads from computing devices operating in a particular rack, or computing devices in a particular half of a rack (for example, top half and bottom half).

In some embodiments, loads are shed by tripping circuit breakers in power panels 120. In one embodiment, circuit breakers are tripped in response to one of load shedding devices 124 receiving a shed signal from load shedding management system 126. Loads may be shed by tripping breakers corresponding to, for example, computing devices in a full rack or in half of a rack.

In FIG. 1, load shedding devices 124 are provided in power panels that feed electrical systems in racks 106. Load shedding devices may, nevertheless, be included in other levels and locations in a power distribution system. For example, various of power components in the power distribution chain, including UPSs 118, rack PDUs 122, or switch gear 114 may include a load shedding device.

In the embodiment described above, shedding can be controlled remotely over the network connection through network 128. Shedding of loads may, however, be controlled from other locations in a data center. In one embodiment, shedding of load circuits is controlled from a control device within a power panel, or in a dedicated shedding control module. In certain embodiments, shedding of load circuits is controlled by instructions sent from a building management system.

In some embodiments, electrical systems, or sets of electrical systems, are assigned one or more identifiers. In some embodiments, power components in a power distribution system, such as power panels, are assigned one or more identifiers. Each identifier may serve as an address for the electrical system, rack system, power component, or a constituent element thereof. The address may be used to map loads (such as server racks) and power components in a system. An identifier may have any suitable format. In some embodiments, a separate identifier may be assigned for the component itself and for additional elements, inputs, or outputs within the component. For example, a separate identifier may be established for each power output receptacle of a power panel.

In some embodiments, signals exchanged with or among load shedding devices are used to monitor and assess characteristics of a power distribution system. For example, a load shedding device in a power panel may include sensors for sensing conditions in a power panel, and the conditions to a load shedding management or building management system. Characteristics of the power distribution system, for example, may be used to measure performance, power quality, power consumption, power draw, stability, service levels, or other attributes of a power distribution system. Examples of characteristics of a power distribution system that may be measured include phase, power redundancy, voltage levels, usage levels, and temperature.

Transformer 110 is coupled to a utility feed. The utility feed may be a medium voltage feed. In certain embodiments, the utility feed is at a voltage of about 13.5 kilovolts or 12.8 kilovolts at a frequency of about 60 Hz. Generators 112 may provide power to primary power systems 116 in the event of a failure of utility power to transformer 110. In one embodiment, one of generators 112 provides back-up power for each of primary power systems 116.

UPS 118 may provide uninterrupted power to racks 106 in the event of a power failure upstream from UPS 118. In certain embodiments, a UPS receives three-phase power from a transformer. The UPS may supply three-phase power to a floor power distribution unit.

PDU power may be any suitable voltage. In one embodiment, electrical power is about 208 V. In one embodiment, electrical power is about 230 V. In some embodiments, different electrical systems 104 may operate on different phases of a primary power system. Each of the legs may correspond to one phase of the input power. In one embodiment, each leg operates at a voltage between about 220 volts to about 260 volts.

In operation of system 100, receptacles in rack PDU 122 may be used to supply power to electrical systems in rack 106, such as servers. Electrical systems 104 may be coupled to rack power distribution unit 122 by way of cables.

Each of the legs in rack PDU 122 may include a breaker. In one embodiment, each breaker is a 30A/32A single pole MCB. Breakers may be located such that they can be accessed when server racks are in-line (e.g., at the top of rack power distribution unit 122). In one embodiment, power is provided to a rack PDU by way of an 8AWG/6 mm$^2$ 5 core cable and a 30A NEMA/32A IEC309 3Ph+N+E Plug.

Reserve power system 130 may provide reserve power for any or all of the electrical systems 104 supplied by primary power systems 116. In some embodiments, reserve power system 130 is powered up at all times during operation of system 100. Reserve power system 130 may be passive until a failure of one or more components of the primary power system for one or more of electrical systems 104, at which time reserve power system 130 may become active.

For illustrative purposes, three switchgear apparatus 114, four UPSs 118, and ten power panels 120 are shown in FIG. 1. The number of power distribution units, UPSs, switchgear apparatus may, however, vary from embodiment to embodiment (and, within a given embodiment, from system to system). For example, each of UPSs 118 may supply power to any suitable number of power panels 120. As another example, each of switchgear apparatus 114 may supply power to any suitable number of UPSs 118.

In some embodiments, a map is generated for electrical systems (for example, servers) that perform operations in a facility, power components in a power distribution system, or both. The map may be based on signals sent from various components in a data center. For example, in the embodiment shown in FIG. 1, a map can be established that includes sets of electrical systems 104 in racks 106 (for example, servers in one half of a particular rack), rack PDUs 122, power panels 120, and UPSs 118.

In some embodiments, computing assets are mapped to one or more power distribution system components and/or branches. Mapping may be based on IDs assigned to one or more assets, or sets of assets, of a system. In one embodiment, sets of computing devices operating in racks are mapped to circuit breakers that provide overcurrent protection for that set of computing devices. For example, Servers ID0001 through 0010 in Rack 0006 in Data Center 4 may be mapped to Circuit Breaker A021 in Power Panel PP062 in Data Center 4; Servers ID0011 through 0020 in Rack 0007 of Data Center 4 may be mapped to Circuit Breaker A022 in Power Panel PP062 in Data Center 4; etc. Load shedding may be implemented and monitored based on the mapping.

In some embodiments, baseline data for mapping of components one or more a computing facilities are stored in a database. At a later time, the map may be updated based on a new set of messages from components in the computing facilities. Comparisons between the baseline data and current data may be used to assess conditions or components.

In some embodiments, electrical power draw is assessed in one or more locations in a power distribution system. Power consumption may be monitored at any location in a power distribution system, including power supply units, rack PDUs, or UPSs. In certain embodiments, a system may perform corrective actions, such as switching to reserve power or shutting down an electrical system, based on power consumption information for one or more power components in a power distribution system.

Electrical systems managed using load shedding systems may be of various types. Examples include hospital equipment, utility systems, security systems, military systems, telecommunications systems, or electronic commerce systems. In certain embodiments, a load shedding system protects operation of a critical system, such as a life support system. In some embodiments, the systems are computing devices (for example, servers) in a data center.

Figure 2:
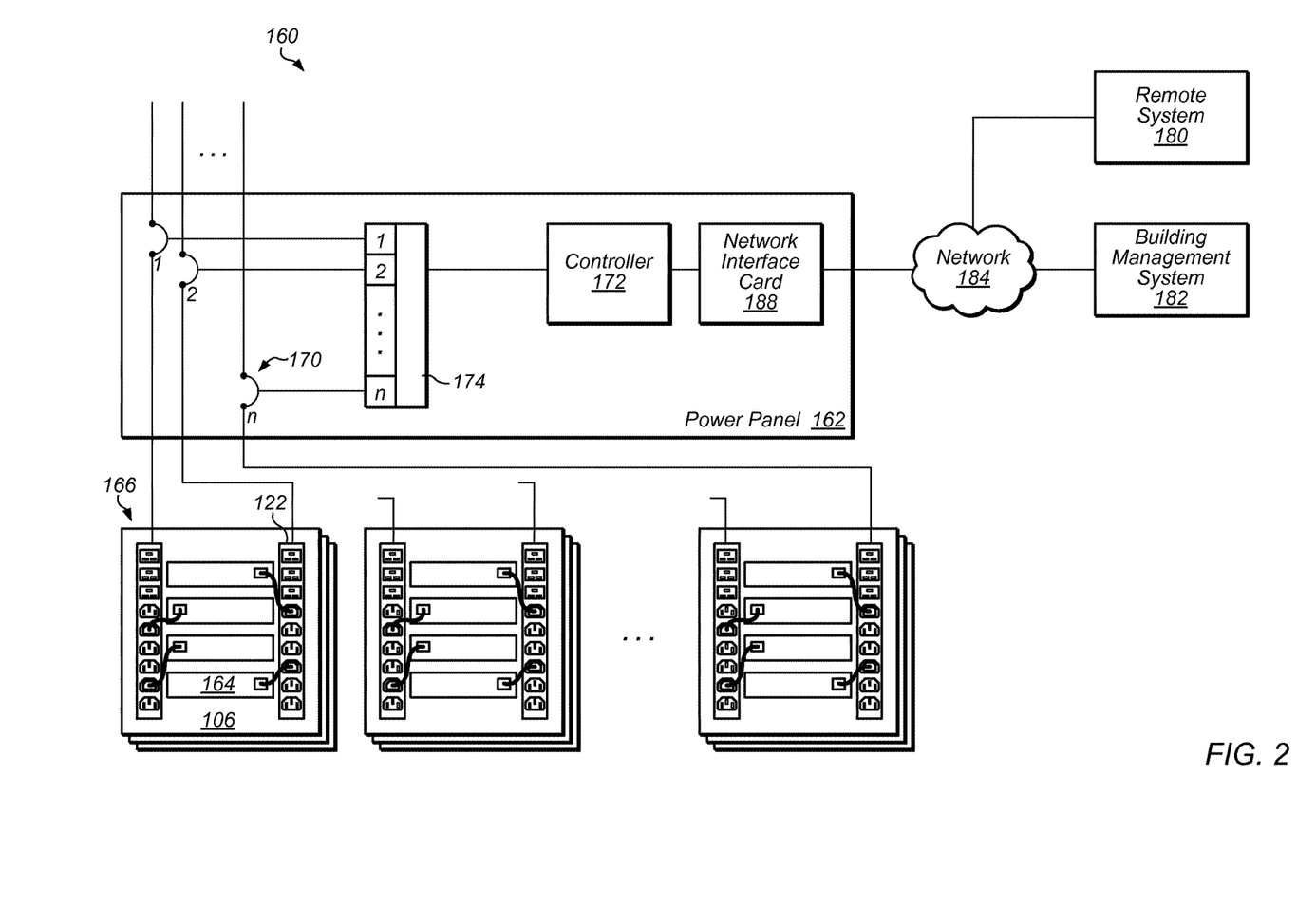
FIG. 2 illustrates one embodiment of a system with a power panel having a load shedding control device.

FIG. 2 illustrates one embodiment of a system with a power panel having a load shedding control device. System 160 includes power panel 162. Power panel 162 distributes power to computing devices 164 in rack computing systems 166.

Power panel 162 includes circuit breakers 170, controller 172, and shunt trip relays 174. In some embodiments, shunt trip relays 174 are provided on a rail. Shunt trip relays 174 are operable selectively trip any or all of circuit breakers 170. Shunt trip relays 174 may serve as switching devices for each of the power circuits supplying electrical systems in rack computing systems 166. Controller 172 may control shunt trip relays 174.

Controller 172 may be coupled to remote systems 180 and building management system 182 by way of network 184. Network interface card 188 is included in power panel 162 to provide an interface to external systems over network 184. Controller 172 may control shedding operations internally (for example, independent of instructions from other systems), based on instructions or data received from remote systems 180 or building management system 182, or any combination thereof.

Suitable types of circuit breakers for load shedding (for example, circuit breaker 170) may include, in various embodiments, a thermal-magnetic circuit breaker, a magnetic circuit breaker, a mechanical circuit breaker, or an electronic circuit breaker. In certain embodiments, a circuit breaker is remotely resettable (for example, by a load shedding controller). In certain embodiments, a circuit breaker has a timed reset (for example, resetting after automatically after a predetermined time period if an overload condition has been resolved).

Figure 3:
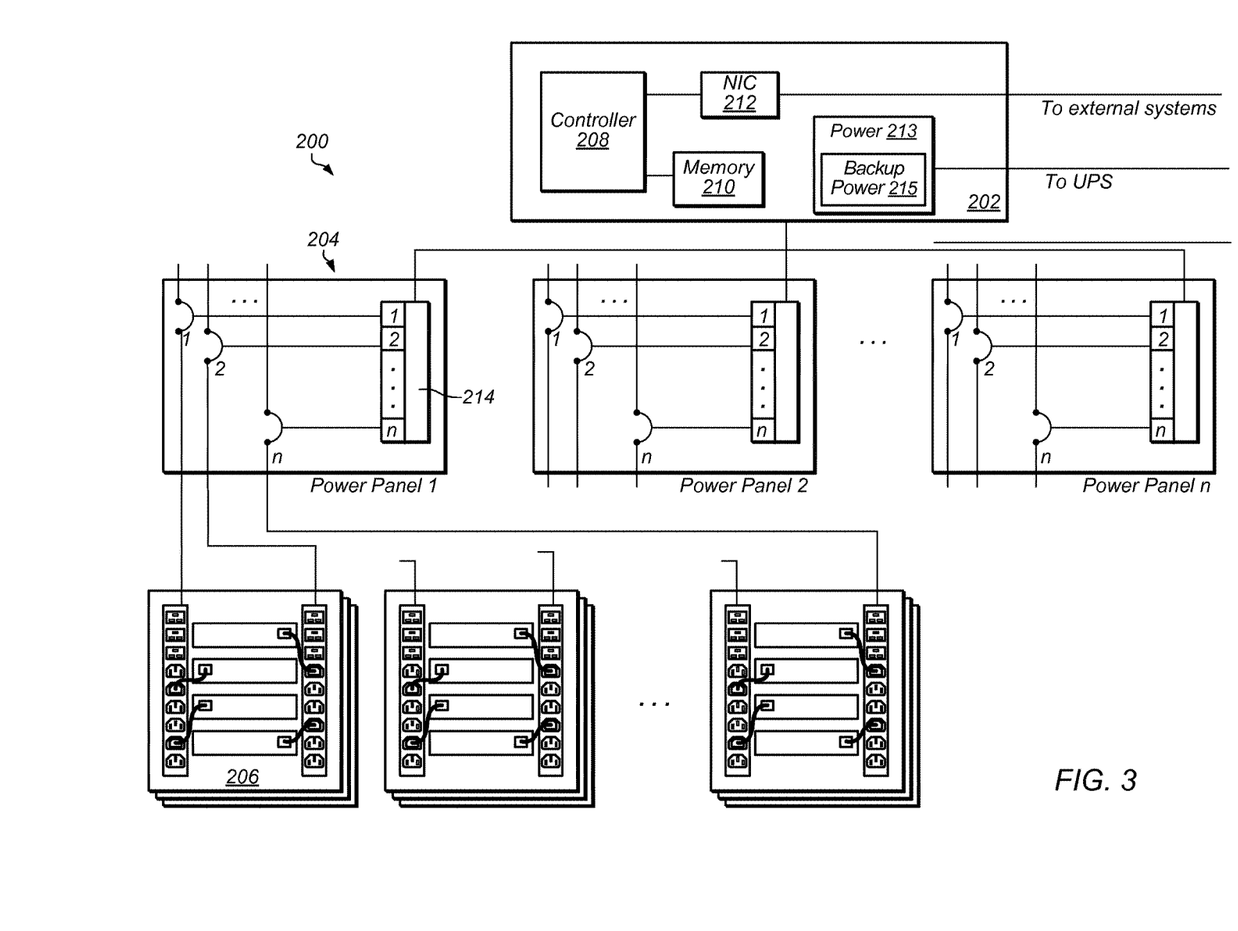
FIG. 3 illustrates one embodiment of a system with a load shedding control unit coupled to multiple power panels.

In some embodiments, a load shedding system includes a control unit that is coupled to load shedding devices for multiple racks within data center. FIG. 3 illustrates one embodiment of a system having a load shedding control unit coupled to multiple power panels. System 200 includes control unit 202 and power panels 204. Power panels 204 supply power to computing devices in rack computing systems 206. Control unit 202 includes controller 208, memory 210, and network interface card 212. Controller 208 includes a microprocessor that implements program instructions for operating switching devices 214 in power panels 204. Controller 208 may exchange information with external systems by way of network interface card 212. Controller 208 may store and access information on memory 210 for use in controlling load shedding operations in rack computing systems 206. Switching devices 214 may be, for example, shunt trip relays as described above relative to FIG. 2.

In some embodiments, components of control unit 202 are contained in an enclosure. The enclosure may be mounted inside a rack, on a rack, or at another location. In some embodiments, a load shedding device is rack-mountable. A load shedding device may be any shape and size. In certain embodiments, a load shedding device has a "zero U" form factor that allows installation in a rack such that the system does not consume any of the slots in a rack.

In some embodiments, a load shedding system operates switching devices to resume power to computing devices. For example, if the potential overload conditions that originally prompted a load circuit to be shed subside, a load shedding system may switch power back on the devices in the load circuit. In FIG. 3, for example, controller 208 may operate switching devices 214 to resume power to computing devices in rack computing systems 206.

In some embodiments, a load shedding system includes data storage elements. For example, control unit 202 may include data storage elements for storing addresses corresponding to various sets of computing devices for a rack or half-rack. In some embodiments, an address may be stored in association with a physical location within a data center (for example, Row 6, Rack 4, left-side rack PDU.)

Network interface card 212 may exchange data and signals between control unit 202 and external systems by way of a network connection. In some embodiments, a load shedding device receives control instructions from an external system. In one embodiment, network interface card 212 is an Ethernet card. In another embodiment, network interface card 212 provides for a fiber optic transmission of data. In some embodiments, each of output is assigned an address, which is stored in memory 210.

Power module 213 may supply power to controller 208, memory 210, and NIC 212. Power module 213 includes backup power device 215. Power module 413 may receive power from the primary power system (for example, from power lines coming into one of power panels 204). Backup power device 215 may serve as backup power for control unit 202. Backup power device 215 may be any device that can at least temporarily supply power to control unit 202 in the event of a power loss from external sources (for example, if the primary power to which power module 413 is connected to has failed). Backup power device 215 may be, for example, a battery or a backup power capacitor. Power module may also be connected to an external reserve power source, such as a UPS.

In some embodiments, a load shedding control system operates switching devices in rack power distribution units ("rack PDUs"). The switching devices in the rack PDUs may be in addition to, or instead of, switching devices for shedding at higher levels in a power chain. As an example, a rack may include two rack PDUs, each of which supplies power to two banks of output receptacles. Each bank of output receptacles may be protected by its own circuit breaker. In one embodiment, a load shedding controller may independently operate shunt trip relays on each of 4 circuit breakers in a rack. Load shedding with the load shedding controller may be implemented at a quarter-rack level.

In some embodiments, a load shedding system reports to external systems status or other information relating to the load shedding system, electrical loads, and power distribution systems supplying power to electrical loads. Control unit 202 may report, for example, whether power is being fed to power panels, which power panels are receiving a feed, what phase combination is being fed, how long the feed has been on.

In some embodiments, messages are sent from a back-up feed device using Simple Network Management Protocol (SNMP) data (for example, an SNMP trap). Any network protocol, however, may be used in various embodiments to send data from, or receive data into, a load shedding device.

In some embodiments, a load shedding system may control an alarm on the load shedding system or at the location of the rack PDUs. An alarm may be, for example, an audible alarm (such as a buzzer or siren) or a visual alarm (flashing light).

In some embodiments, a control system is coupled to load shedding devices in two or more different facilities. For example, a control system may control load shedding devices at multiple data centers, in multiple locations. The control system may shed loads in particular sets of computing devices at each data center, for example, on a rack-by-rack basis or half rack-by-half rack basis. In some embodiments, the control system assesses conditions, characteristics, or status of computing operations or data in computing devices in each of multiple facilities. The system may determine which loads to shed, and in which facilities, based on the assessment.

Figure 4:
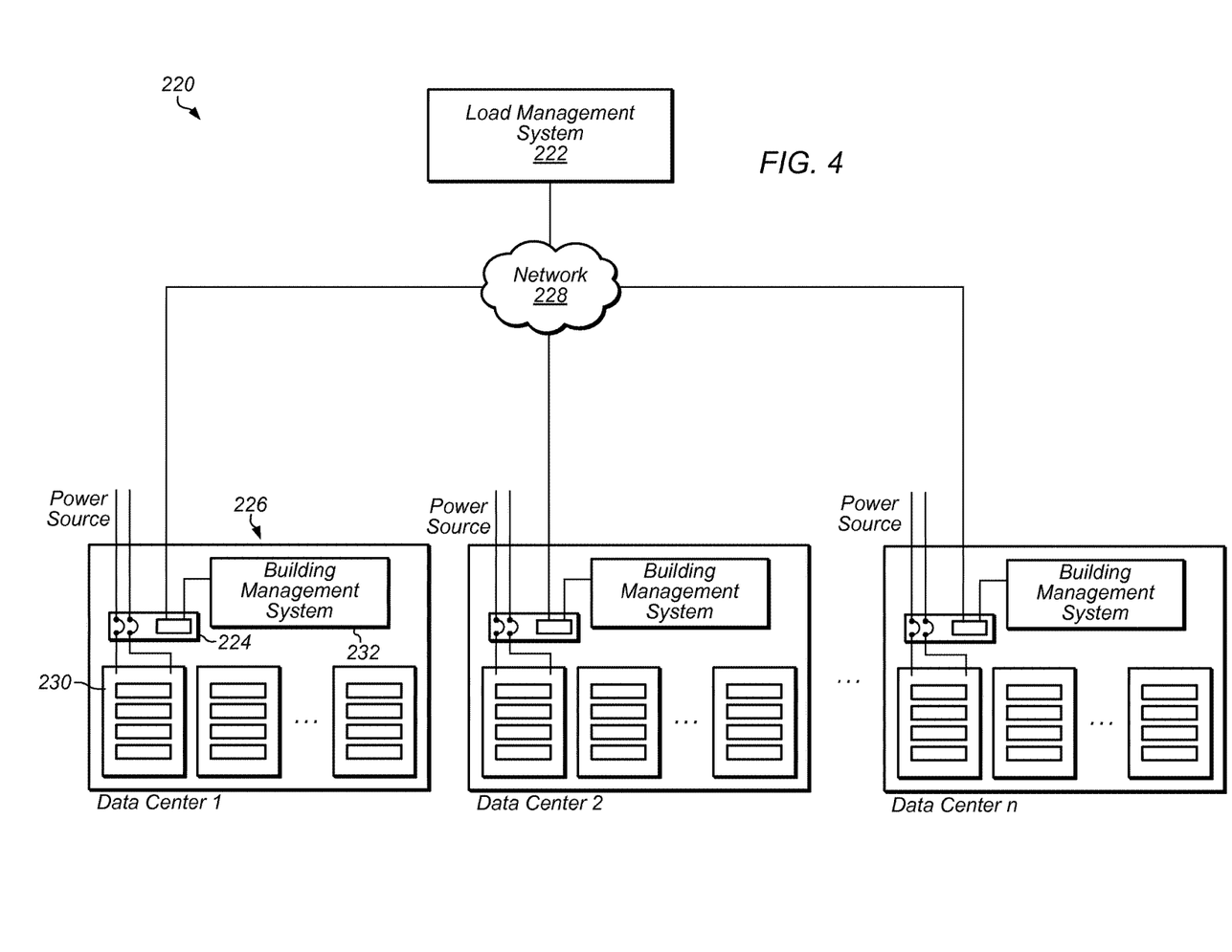
FIG. 4 illustrates one embodiment of a system including a load shedding control system having a network connection to load shedding devices in multiple data centers.

FIG. 4 illustrates one embodiment of a system including a load shedding control system coupled to load shedding devices in multiple data centers. System 220 includes load management system 222. Load management system 222 is coupled to load shedding devices 224 in data centers 226 by way of network 228. Load shedding devices 224 may also be coupled to, and exchange information with, building management system 232. Rack computing systems 230 may be operated to perform computing operations in data centers 226.

Load management system 222 may be operated to shed loads from various one of rack computing systems 230 in data centers 226. In some embodiments, load management system 222 exchanges information with systems in data centers 226 to monitor and assess configurations, conditions, and status of computing operations and power in data centers 226. In certain embodiments, load management system 222 uses mapping data to map computing devices, power components, or both.

Figure 5:
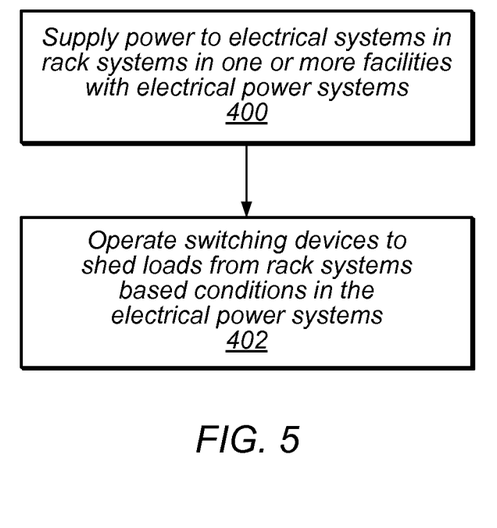
FIG. 5 illustrates one embodiment of shedding loads from rack systems on an electrical power system.

In some embodiments, a system selectively sheds loads from particular rack computing systems in a data center. Load shedding devices may operate to remove power, for example, one rack at a time, or half a rack at a time. FIG. 5 illustrates one embodiment of shedding loads from rack systems on an electrical power system. At 400, power is supplied to electrical systems in rack systems in one or more facilities with electrical power systems. A facility may be, for example, a data center. The rack systems may include, for example, a set of servers.

At 402, based conditions in the electrical power system, switching devices are operated to shed loads on the electrical power systems from electrical systems in one or more rack systems. In one embodiment, the switching devices are shunt trip relays that trip circuit breakers in the power supply line to a set of computing devices in one of the racks.

In some embodiments, loads are shed on a load circuit-by-load circuit basis. For example, loads may be shed from computing devices operating in a particular rack, or computing devices in a particular half of a rack (for example, top half and bottom half).

In some embodiments, loads from selected rack systems are shed to maintain an aggregate load on the electrical system within acceptable limits. For example, in a data center in which computing devices are operating in 100 racks in the data center, loads from computing devices in 3 of the rack systems in the data center.

In some embodiments, loads are shed in a portion of a facility based on aggregate conditions, characteristics, or status of operations for at another portion of the facility. For example, if loads on a power distribution system spike because increased activity in Rack Computing Systems A, B, C in a data center, the system may shed loads from computing devices in Rack Computing System D.

In some embodiments, loads are shed in a portion of a facility based on conditions, characteristics, or status of operations for the entire facility. For example, if the aggregate loads on the primary power distribution system in a data center exceed a predetermined threshold, then selected rack computing systems within the facility may be shed to reduce the aggregate load. In one embodiment, the system sheds loads on an incremental basis (for example, half a rack at a time) until the aggregate loads drops to a predetermined level.

In some embodiments, loads are shed in one set of computing devices in a data center based on conditions, characteristics, or status of operations of another set of computing devices operating in the data center. In certain embodiments, conditions, characteristics, or status of one set of computing devices are assessed before shedding loads on another set of computing devices. For example, if computing services are being provided to a customer from Rack Computing Systems A, B, and C, the system may verify that Rack Computing Systems A and B are operating before shedding loads in Rack Computing System C.

In some embodiments, loads are shed at one computing facility based on conditions, characteristics, or status of operations at another computing facility. In certain embodiments, conditions, characteristics, or status at one data center are assessed at one facility before shedding loads are shed at another facility. For example, if a particular customer's data is maintained in redundant form at Data Center A and Data Center B, the system may verify that data storage devices in Data Center B have a current set of the customer's data before shedding corresponding data storage devices in Data Center A that hold the customer's data.

Loads may be shed according to a predetermined schedule. Schedules may be defined based on various user-selected criteria and stored in memory of the load shedding management system. A schedule may include parameters for execution of shedding load circuits, including, for example, dates, times, order, sequence, and priority. During computing operations, the schedules can be retrieved from memory and implemented to shed loads from electrical power systems at one or more facilities.

In some embodiments, load shedding is triggered only after predetermined events or operations have occurred. For example, load shedding may be controlled such that set of data storage devices complete read/write operations before being shed from the system.

In certain embodiments, load circuits are switched back on after being shed from an electrical power system. Switching may be accomplished manually, automatically (for example, by a switching device in the load shedding system, or combination thereof. Resumption of power to circuits that have been shed may be carried out based on predetermined sequence or schedule.

In some embodiments, determining shedding of loads is carried out by implementing one or more rules. Rules may be applied, for example, to automatically determine which circuits should be shed, in what order, and on what time schedule. Load shedding may in certain embodiments include one or more optimization calculations.

In some embodiments, a load shedding system senses one or more characteristics or conditions of power in systems. Examples of power characteristics and conditions that may be sensed by a power sensing device include power loss, power anomaly, phase, power redundancy, current levels, voltage levels, usage levels, and temperature. The load shedding system may use information to control the shedding at the location being sensed, or at another location.

In certain embodiments, a power source for a load shedding system includes a reserve power system. In this case, the power source may include a main power system that provides power the load shedding system under normal conditions, and also a reserve power system that provides power in the event of a failure of the main power system. In one embodiment, reserve power to a load shedding system is implemented by way of an automatic transfer switch. The automatic transfer switch may switch to reserve power in the event of a power loss to the main power system supplying power to the load shedding system.

Although in many of the embodiments described herein, electrical power shedding is described for rack computing systems in a data center, electrical power shedding may, in various embodiments, be performed for other types of electrical systems. For example, electrical power shedding may be performed for electrical systems at a power plant, manufacturing plant, medical care facility, or office building.

Although in many of the embodiments described herein, electrical power shedding is described as a response to overload conditions (actual or potential) on an electrical power system, electrical power shedding may, in various embodiments, be carried out in response to other conditions, events, or circumstances. For example, load shedding may be carried out in response to weather conditions, such as a tornado, hurricane, or flood. In one embodiment, load shedding using load shedding devices is carried out in response to unauthorized access to electrical systems (such as a hacker attack on a computing facility), or the risk of such unauthorized access.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   two or more respective rack computing systems, each of the respective rack computing systems comprising a respective rack and one or more computing devices mounted in the respective rack;
   a primary electrical power system configured to supply power to the computing devices mounted in at least two of the two or more respective racks, wherein the electrical power system comprises, for at least two of the respective rack computing systems, at least two respective overcurrent protection devices configured to protect computing devices of respective ones of the at least two respective rack computing systems from overcurrent conditions; and
   a controller coupled to two or more of the at least two respective overcurrent protection devices, wherein the controller is configured to trigger a given one of the overcurrent protection devices to open such that loads from two or more computing devices are shed from the electrical power system,
   wherein the controller is configured to control the at least two respective overcurrent protection devices independently of one another, wherein each of the overcurrent protection devices is coupled to a different set of two or more computing devices.

2. The data center of claim 1, wherein the overcurrent protection device for at least one of the respective rack computing systems is a circuit breaker, wherein the controller is configured to trip the circuit breaker to shed loads in computing devices in the at least one of the respective rack computing systems.

3. The data center of claim 2, wherein the controller is coupled to a shunt trip relay, wherein the shunt trip relay is configured to trip the circuit breaker in response to receiving a signal from the controller.

4. The data center of claim 1, wherein the controller is configured to operate at least one of the overcurrent protection devices to shed loads from all of the computing devices in one of the respective racks.

5. The data center of claim 1, wherein the controller is configured to operate at least one of the overcurrent protection devices to shed loads from a subset of the computing devices in one of the respective racks.

6. The data center of claim 1, wherein the controller is configured to shed loads from computing devices in one of the respective rack computing systems based on conditions for computing devices in at least two of the respective rack computing systems.

7. The data center of claim 1, wherein the controller is configured to shed loads from computing devices in one of the respective rack computing systems based on conditions for computing devices in at least one other respective rack computing system of the respective rack computing systems operating in the data center.

8. The data center of claim 1, wherein the controller is in a power panel, wherein the power panel supplies power to at least one of the computing devices in at least one of the respective rack computing systems.

9. A system, comprising:
   two or more respective rack systems, each of the respective rack systems comprising a rack and one or more electrical systems coupled to the rack;
   a primary electrical power system configured to supply power to electrical systems in at least two of the racks, wherein the electrical power system comprises, for at least one of the respective rack systems, at least two respective switching devices configured to isolate power from the electrical power system to at least two or more of the electrical systems in the at least one respective rack system; and
   a control system coupled to at least two of the switching devices, wherein the control system is configured to operate the at least two switching devices to shed respective loads on the primary electrical power system from respective electrical systems of the at least one respective rack system, wherein the control system is configured to control the at least two switching devices independently of one another, wherein each of the at least two switching devices is coupled to a different load circuit, wherein each of the load circuits corresponds to a different set of electrical systems in one or more of the respective rack systems.

10. The system of claim 9, wherein the at least one switching device comprises a circuit breaker, wherein the control system is configured to trip the circuit breaker to shed loads from electrical systems in the at least one respective rack system.

11. The system of claim 10, wherein the control system comprises a shunt trip relay, wherein the shunt trip relay is configured to trip the circuit breaker of the at least one respective rack system in response to receiving a signal.

12. The system of claim 9, wherein the control system is configured to operate at least one of the switching devices to shed loads from all of the electrical systems in one of the racks.

13. The system of claim 9, wherein the control system is configured to operate at least one of the switching devices to shed loads from part of the electrical systems in one of the racks.

14. The system of claim 9, wherein the control system is configured to shed loads from electrical systems in one of the respective rack systems based on conditions for electrical systems in at least two of the respective rack systems.

15. The system of claim 9, wherein the control system is configured to shed loads from electrical systems in one of the respective rack systems based on conditions for electrical systems in at least one of respective rack systems other than the respective rack system whose electrical systems are being shed.

16. The system of claim 9, wherein the control system comprises a controller in a power panel, wherein the power panel supplies power to at least one of the electrical systems in at least one of the racks of the two or more respective rack systems.

17. The system of claim 9, wherein the primary electrical power system further comprises a current transformer coupled to an electrical power line that provides power to electrical systems in at least one of the respective rack systems.

18. The system of claim 9, wherein the control system is coupled to at least one of the switching devices by way of a network connection.

19. The system of claim 9, wherein the control system is configured to trigger at least one of the switching devices to shed loads from one or more of the electrical systems based on a time schedule.

20. The system of claim 9, wherein the control system is configured to operate at least one of the switching devices to shed one or more of the electrical systems after one or more operations have been completed in one or more of the electrical systems.

21. The system of claim 9, wherein the primary electrical power system is included in a facility;

wherein the system further comprises one or more additional primary electrical power systems included in one or more additional facilities, wherein the one or more additional primary electrical power systems comprise one or more additional switching devices configured to selectively isolate power from the one or more additional primary electrical power systems to electrical systems in racks of the two or more additional facilities;

wherein the control system is configured to shed loads on primary electrical power systems at the facility and the one or more additional facilities.

22. The system of claim 21, wherein the control system is configured to shed loads from primary electrical power systems at one of the facilities, wherein the shedding of the loads at one of the facilities is based at least in part on conditions or status in at least one other facility.

23. The system of claim 21, wherein the control system is configured to shed loads from primary electrical power systems at one of the facilities if a backup data or reserve capacity to perform computing operations of the electrical systems being shed exists at another one of the facilities.

24. The system of claim 9, wherein the control system is configured to operate at least one of the switching devices to resume power to at least one of the electrical systems after power to the at least one electrical system has been shed.

25. A method, comprising:

supplying, via one or more primary electrical power systems, power to electrical systems in at least two rack systems in one or more facilities;

operating a switching device to shed loads, on a respective one of the primary electrical power systems, from two or more of the electrical systems in at least one of the rack systems, wherein shedding of the loads is based on one or more conditions in the one or more primary electrical power systems; and operating another switching device to shed other loads, on the respective primary electrical power system or another one of the primary electrical power systems, from another two or more of the electrical systems in at least one of the rack systems, wherein shedding of the other loads is based on one or more conditions in the one or more primary electrical power systems;

wherein the switching device and the other switching device are controlled independently of one another and are coupled to different sets of electrical systems.

26. The method of claim 25, wherein operating the switching device to shed the loads from the two or more electrical systems comprises tripping a circuit breaker to the electrical systems.

27. The method of claim 25, wherein operating the switching device to shed the loads from the two or more electrical systems in one of the rack systems is based on conditions for electrical systems in at least two of the rack systems.

28. The method of claim 25, wherein operating the switching device to shed the loads from the two or more electrical systems in one of the rack systems is based on conditions for electrical systems in at least one other of the rack systems.

29. The method of claim 25, wherein operating the switching device to shed the loads from the two or more electrical systems is performed based on a predetermined schedule.

30. The method of claim 25, further comprising completing one or more wind up operations in one or more of the electrical systems before operating the switching device to shed the loads from the two or more electrical systems.

31. The method of claim 25, wherein operating the switching device to shed the loads on a respective one of the primary electrical power systems at one of the facilities is based at least in part on conditions or status in at least one other facility.

32. The method of claim 25, wherein operating the switching device to shed the loads at least one facility comprises verifying that a backup for one or more of the electrical systems being shed exists at another one of the facilities.

33. The method of claim 25, further comprising operating at least one of the switching devices to resume power to at least one of the electrical systems.

34. The method of claim 25, further comprising mapping at least some of the rack systems or at least some of the electrical systems in the racks, wherein shedding the loads is based at least in part on the mapping of the rack systems or the electrical systems.

35. The method of claim 25, further comprising monitoring loads from at least some of the electrical systems of the rack systems.

36. A load shedding control system, comprising:
   a controller; and
   two or more load shedding devices coupled to the controller, wherein the controller is configured to operate a given one of the load shedding devices to trip a circuit breaker to shed two or more loads on at least one primary electrical power system that is supplying electrical power to computing devices operating in a data center,
   wherein the controller is configured to separately control the two or more load shedding devices independently of one another, wherein each of the load shedding devices is coupled to a different set of two or more loads.

37. The load shedding control system of claim 36, wherein the controller is configured to operate at least one of the load shedding devices to trip a circuit breaker in response to receiving a signal over a network.

38. The load shedding control system of claim 36, wherein the one or more load shedding devices comprise respective switching devices each in respective power panels of two or more power panels, wherein the respective switching devices are coupled to the controller, wherein the controller is configured to separately control the respective switching devices in the power panels.

\* \* \* \* \*